US012652989B2

(12) United States Patent
Yun et al.

(10) Patent No.: US 12,652,989 B2
(45) Date of Patent: Jun. 9, 2026

(54) SUPPORTING UNIT AND SUBSTRATE TREATING APPARATUS INCLUDING THE SAME

(71) Applicant: SEMES CO., LTD., Cheonan-si (KR)

(72) Inventors: Kang Seop Yun, Cheonan-si (KR); Chul Goo Kim, Sejong-si (KR); Jung Bong Choi, Suwon-si (KR); Soo Han Song, Goyang-si (KR)

(73) Assignee: SEMES CO., LTD., Cheonan-si (KR)

( * ) Notice: Subject to any disclaimer, the term of this patent is extended or adjusted under 35 U.S.C. 154(b) by 267 days.

(21) Appl. No.: 17/543,761

(22) Filed: Dec. 7, 2021

(65) Prior Publication Data

US 2022/0181168 A1      Jun. 9, 2022

(30) Foreign Application Priority Data

Dec. 7, 2020      (KR) ........................ 10-2020-0169609

(51) Int. Cl.
*H01L 21/67* (2006.01)
*H01L 21/687* (2006.01)

(52) U.S. Cl.
CPC .. *H01L 21/67115* (2013.01); *H01L 21/67051* (2013.01); *H01L 21/6708* (2013.01); *H01L 21/68785* (2013.01); *H01L 21/6875* (2013.01); *H01L 21/68792* (2013.01)

(58) Field of Classification Search
CPC ........... H01L 21/67051; H01L 21/6708; H01L 21/67115; H01L 21/6715; H01L 21/67167; H01L 21/67173; H01L 21/67248; H01L 21/68742; H01L 21/6875; H01L 21/68785; H01L 21/68792; C23C 16/4584; C23C 16/4585; C23C 16/4586; C23C 16/481; C23C 16/482
See application file for complete search history.

(56) References Cited

U.S. PATENT DOCUMENTS

| | | | | |
|---|---|---|---|---|
| 4,789,771 A | * | 12/1988 | Robinson | .............. C30B 25/105 219/405 |
| 5,294,778 A | * | 3/1994 | Carman | ............ H01L 21/67103 338/217 |
| 6,108,491 A | * | 8/2000 | Anderson | ......... H01L 21/67115 392/416 |
| 6,570,134 B2 | * | 5/2003 | Suzuki | .............. H01L 21/67115 118/724 |
| 6,600,138 B2 | * | 7/2003 | Hauf | ................. H01L 21/67115 219/390 |
| 6,638,188 B2 | | 10/2003 | Kleinpell | |
| 6,707,011 B2 | | 3/2004 | Tay et al. | |
| 6,746,350 B2 | | 6/2004 | Hartman | |

(Continued)

FOREIGN PATENT DOCUMENTS

| | | |
|---|---|---|
| CN | 1507648 | 6/2004 |
| CN | 110349885 | 10/2019 |

(Continued)

*Primary Examiner* — Kurt Sweely

(57) ABSTRACT

The inventive concept provides a substrate support unit comprising a chuck supporting and rotating a substrate; and a lamp unit provided below the substrate to heat the substrate, wherein the lamp unit comprises a first lamp having a reflective layer on the surface thereof, to block and/or reflect a light which is emitted from the first lamp but not directed to the substrate to direct the light to the substrate.

13 Claims, 6 Drawing Sheets

342: 342a, 342b

(56)                References Cited

U.S. PATENT DOCUMENTS

| | | | | |
|---|---|---|---|---|
| 7,772,527 B2 * | 8/2010 | Choi | .................. | F27B 17/0025 |
| | | | | 392/416 |
| 11,043,403 B2 | 6/2021 | Kim | | |
| 2006/0291832 A1 * | 12/2006 | Ito | ..................... | H01L 21/67115 |
| | | | | 392/416 |
| 2015/0034133 A1 * | 2/2015 | Kim | ................. | H01L 21/67051 |
| | | | | 134/105 |
| 2016/0013079 A1 * | 1/2016 | Choi | ................. | H01L 21/67051 |
| | | | | 156/345.21 |
| 2016/0348240 A1 * | 12/2016 | Burrows | ............. | H01L 21/6719 |
| 2019/0110336 A1 * | 4/2019 | Cong | ....................... | H01K 1/58 |
| 2019/0311923 A1 * | 10/2019 | Kim | ................... | H01L 21/6708 |
| 2019/0318946 A1 * | 10/2019 | Kim | ................. | H01L 21/67115 |

FOREIGN PATENT DOCUMENTS

| | | |
|---|---|---|
| KR | 10-2014-0047564 | 4/2014 |
| KR | 10-2017-0026901 | 3/2017 |
| KR | 10-2019-0117373 | 10/2019 |
| KR | 10-2019-0131916 | 11/2019 |

* cited by examiner

SUPPORTING UNIT AND SUBSTRATE TREATING APPARATUS INCLUDING THE SAME

CROSS-REFERENCE TO RELATED APPLICATIONS

A claim for priority under 35 U.S.C. § 119 is made to Korean Patent Application No. 10-2020-0169609 filed on Dec. 7, 2020, in the Korean Intellectual Property Office, the entire contents of which are hereby incorporated by reference.

BACKGROUND

Embodiments of the inventive concept described herein relate to a support unit and a substrate treating apparatus including the same and, more specifically, to a support unit for performing a process while heating a substrate during a substrate treating process and a substrate treating apparatus including the same.

In general, various processes such as a photoresist coating process, a developing process, an etching process, and an ashing process are carried out to manufacture a semiconductor device or a flat display panel. In each process, in order to remove various contaminants attached to the substrate, a cleaning process using a chemical or a deionized water and a drying process for drying the chemical or the deionized water remaining on the surface of the substrate are performed.

Recently, an etching process using high temperature chemicals such as a sulfuric acid and a phosphoric acid to selectively remove a silicon nitride film and a silicon oxide film is being performed. In a substrate treating apparatus using a high-temperature chemical, a substrate treating apparatus for heating a substrate is used to improve an etching rate. U.S. Patent Application Publication No. 2016-0013079 discloses an embodiment of the above-described substrate treating apparatus. According to the above patent, the substrate treating apparatus includes a lamp for heating a substrate in a spin head and a reflective plate for reflecting heat radiated by the lamp.

However, since a heat source in the form of the lamp emits is omnidirectional and thus emit heat wave in all directions with same intensity, when treating a substrate using the patented device, much energy is wasted owing to omnidirectionality of the lamp heat wave.

In addition, there is a problem in that the emitted heat of the lamp not directed toward the substrate may heat neighboring components, thereby damaging and/or deforming thereof.

In addition, when all of the various components neighboring the lamp are formed of heat-resistant materials in order to prevent damage and/or deformation, material costs are very high, and even in this case, it is very difficult to ensure long-term reliability.

SUMMARY

Embodiments of the inventive concept provide a support unit capable of improving substrate treating efficiency and a substrate treating apparatus including the same.

Embodiments of the inventive concept provide a support unit capable of improving the efficiency of a lamp and a substrate treating apparatus including the same.

Embodiments of the inventive concept provide a support unit capable of improving a thermal stability of components adjacent to or neighboring the lamp and a substrate treating apparatus including the same.

An object of the inventive concept is not limited thereto, and other objects not mentioned may be clearly understood by those skilled in the art from the following description.

The technical objectives of the inventive concept are not limited to the above-mentioned ones, and the other unmentioned technical objects will become apparent to those skilled in the art from the following description.

The inventive concept provides a substrate support unit supporting a substrate.

The substrate support unit comprises a chuck supporting and rotating a substrate; and a lamp unit provided below the substrate to heat the substrate, wherein the lamp unit comprises a first lamp having a reflective layer on a surface thereof, to block and/or reflect a light which is emitted from the first lamp but not directed to the substrate to direct the light to the substrate.

In an embodiment, a first end portion of the reflective layer is located on a first path of a light emitted from the first lamp to an end of the substrate when seen from a vertical cross-section.

In an embodiment, the support unit further comprises a reflective plate including a protrusion reflecting a light emitted from the first lamp to an edge region of the substrate, and a second end portion of the reflective layer is located on a second path of the light emitted from the first lamp to an edge region of the reflective plate.

In an embodiment, the support unit further comprises a reflective plate including a protrusion reflecting the light emitted from the first lamp to an edge region of the substrate, and the reflective layer is provided at the surface of the first lamp which is opposite to a surface facing the protrusion.

In an embodiment, the reflective layer is provided at a position blocking the light which is emitted from the first lamp but is not directly directed to the substrate.

In an embodiment, the reflective layer is provided at a position blocking lights which are reflected by the reflective plant and/or emitted from the first lamp but are not directly directed to the substrate among the light reflected by the reflective plate and emitted from the first lamp.

In an embodiment, the first lamp is provided as a ring shape, the lamp unit further comprises one or a plurality of second lamps located at an inner side of the first lamp, and the reflective layer is provided only at the first lamp among the first lamp and the second lamp.

The inventive concept provides a substrate treating apparatus.

The substrate treating apparatus comprises a bowl having an inner processing space; a support unit supporting a substrate within the processing space; a liquid supply unit supplying a treating liquid to the substrate supported by the support unit, wherein the support unit comprises: a chuck supporting and rotating the substrate; a heating unit heating the substrate supported by the chuck; the heating unit comprising a first lamp under the substrate to heat the substrate supported by the chuck, and provided with a reflective layer on a portion of the surface thereof to block and/or reflect a light which is emitted from the first lamp but not directed to the substrate to direct the light to the substrate.

In an embodiment, the first lamp is provided as a ring shape, the heating unit is provided as a ring shape and comprises one or a plurality of second lamps located at an inside of the first lamp, and the reflective layer is provided only at the first lamp among the first lamp and the second lamp.

In an embodiment, the chuck comprises a chuck stage and a transmission plate in combination defining an inner space, the transmission plate being adjacent the substrate and transmitting a light emitted from the heat unit to the substrate, and the lamp is provided in the inner space of the chuck.

In an embodiment, a chuck pin upwardly protruding from the chuck stage during processing and supporting the edge of the substrate may be provided.

In an embodiment, the heating unit is provided to be non-rotatory while the chuck is rotating.

In an embodiment, the reflective layer is located at a position at which the first end of the reflective layer is located on a line passing a center of the first lamp and a contact point of the chuck pin and the substrate supported by the chuck pin when seen from a vertical cross-section in an up/down direction.

In an embodiment, the support unit further comprises a reflective plate including a protrusion reflecting a light emitted from the first lamp to the edge region of the substrate, and the reflective layer is provided at a surface of the first lamp not facing the protrusion.

In an embodiment, the protrusion is placed between the first lamp placed at an outermost edge of the lamps, and the second lamp adjacent to the first lamp.

In an embodiment, at least some of the protrusion comprises a curving surface formed in a round shape.

In an embodiment, the reflective layer is provided at a surface of the first lamp which is opposite to a surface facing the protrusion.

The inventive concept provides a substrate treating apparatus.

The substrate treating apparatus comprises a bowl with an inner processing space; a support unit supporting a substrate inside the processing space; a liquid supply unit supplying a treating liquid to the substrate supported by the support unit, wherein the support unit comprises: a chuck stage supporting and rotating the substrate; a heating unit heating the substrate supported by the chuck; and a transmission plate placed between the substrate supported by the support unit and the heating unit, transmitting a light emitted from the heating unit, the heating unit comprising: a first lamp located between the chuck stage and the substrate supported by the chuck stage, provided as a ring shape, and provided with a reflective layer on a portion of the surface thereof; and one or a plurality of second lamps located at an inside of the first lamp.

In an embodiment, the reflective layer is not provided at a region of the surface of the first lamp emitting light directly toward the substrate.

In an embodiment, substrate treating apparatus further comprises a chuck pin on the chuck stage and penetrating the transmission plate, the chuck pin upwardly protrudes from the transmission plate during processing and supporting the edge of the substrate, and the reflective layer is located at a position at which the first end of the reflective layer is located on a line passing a center of the first lamp and a contact point of the chuck pin and the substrate supported by the chuck pin.

According to the inventive concept, it is possible to improve a substrate treating efficiency.

In addition, according to an embodiment of the inventive concept, it is possible to improve the efficiency of the lamp by returning an energy directed in a direction other than the substrate back toward the substrate.

In addition, according to an embodiment of the inventive concept, a thermal stability of peripheral components adjacent to the lamp may be improved by blocking an energy directed in a direction other than the substrate.

The effects of the inventive concept are not limited to the above-described effects, and effects not mentioned will be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
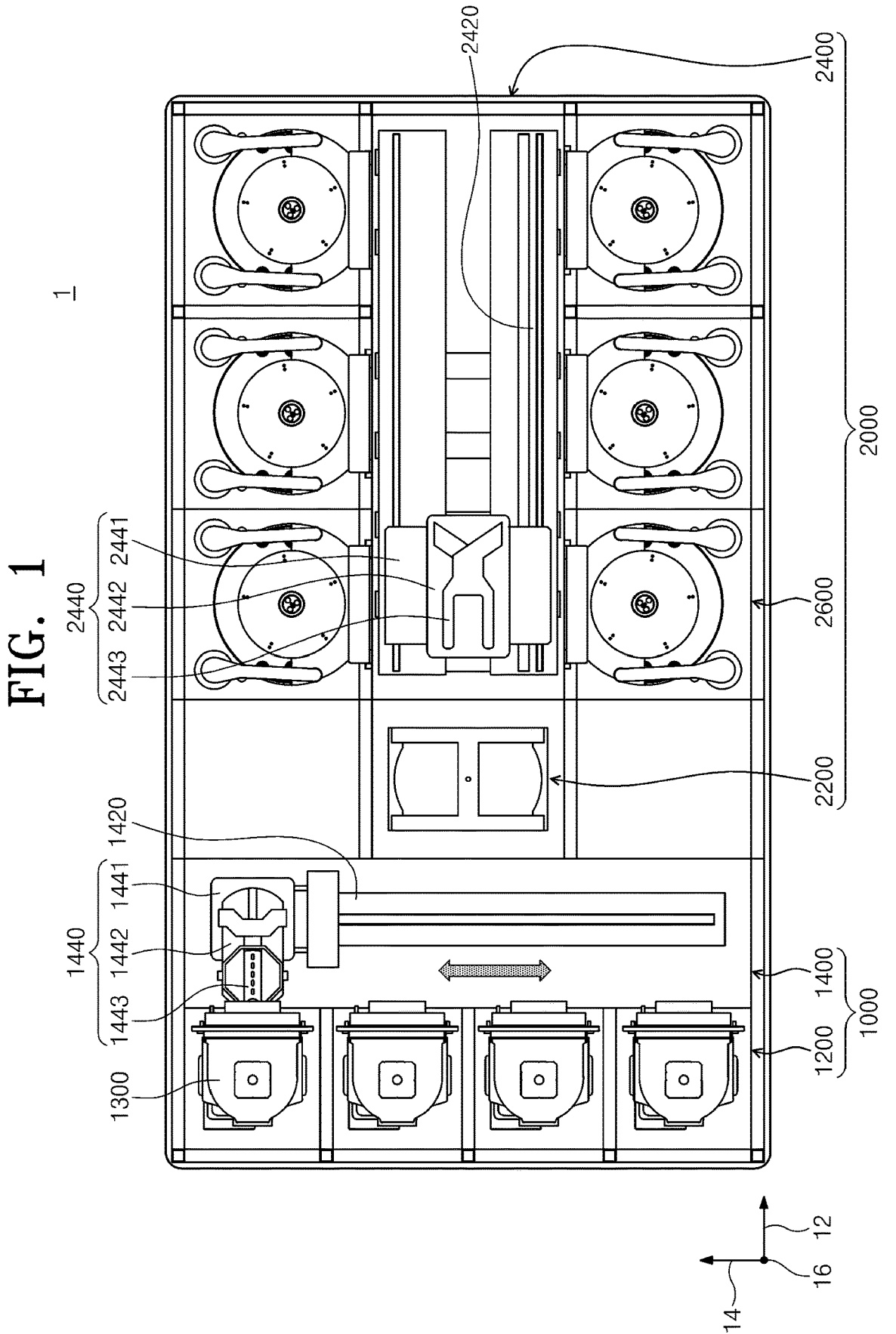
FIG. 1 is a schematic plan view illustrating a substrate treating facility provided with a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to FIG. 1 to FIG. 6.

FIG. 1 is a plan view schematically illustrating a substrate treating facility provided with a substrate treating apparatus according to an embodiment of the inventive concept.

Referring to FIG. 1, a substrate treating facility 1 includes an index module 1000 and a process module 2000. The index module 1000 includes a load port 1200 and a transfer frame 1400. The load port 1200, the transfer frame 1400, and the process module 2000 are sequentially arranged in a row. Hereinafter, a direction in which the load port 1200, the transfer frame 1400, and the process module 2000 are arranged is referred to as a first direction 12. Also, a direction perpendicular to the first direction 12 when viewed from above is referred to as a second direction 14, and a direction perpendicular to a plane including the first direction 12 and the second direction 14 is referred to as a third direction 16.

A carrier 1300 in which a substrate W is stored is mounted on the load port 1200. A plurality of load ports 1200 are provided, and they are arranged in a row along the second direction 14. FIG. 1 illustrates that four load ports 1200 are provided. However, the number of load ports 1200 may increase or decrease according to conditions such as process efficiency and a footprint of the process module 2000. A slot (not shown) provided to support the edge of the substrate W is formed in the carrier 1300. A plurality of slots are provided in the third direction 16 in the carrier 1300. The substrate W is positioned within the carrier 1300 and stacked one above another while being spaced apart in the third direction 16. A front opening unified pod (FOUP) may be used as the carrier 1300.

The process module 2000 includes a buffer unit 2200, a transfer chamber 2400, and a process chamber 2600. The transfer chamber 2400 is provided such that its lengthwise direction is parallel to the first direction 12. The process chambers 2600 are disposed at one side and another side of the transfer chamber 2400 along the second direction 14, respectively. The process chambers 2600 located at one side of the transfer chamber 2400 and the process chambers 2600 located at another side of the transfer chamber 2400 are provided to be symmetrical to each other with respect to the transfer chamber 2400. A plurality of process chambers 2600 are provided along the lengthwise direction of the transfer chamber 2400. In addition, some process chambers 2600 are stacked one above another. That is, the process chambers 2600 may be arranged on one or both side of the transfer chamber 2400 in an array of A×B (A and B are natural numbers of 1 or more, respectively). Here, A is the number of process chambers 2600 provided in a row along the first direction 12, and B is the number of process chambers 2600 provided in a row along the third direction 16. When four or six process chambers 2600 are provided on one side of the transfer chamber 2400, the process chambers 2600 may be arranged in an array of 2×2 or 3×2. The number of process chambers 2600 may increase or decrease. The process chamber 2600 may be provided only on one side of the transfer chamber 2400. In addition, the process chamber 2600 may be provided in a single layer on one side and/or both sides of the transfer chamber 2400.

The buffer unit 2200 is disposed between the transfer frame 1400 and the transfer chamber 2400. The buffer unit 2200 provides a space in which the substrate W stays before the substrate W is transferred between the transfer chamber 2400 and the transfer frame 1400. The buffer unit 2200 is provided with a slot (not illustrated) in which the substrate W is placed therein, and a plurality of slots (not illustrated) are provided to be spaced apart along the third direction 16. Each of a surface facing the transfer frame 1400 and a surface facing the transfer chamber 2400 of the buffer unit 2200 are opened.

The transfer frame 1400 transfers the substrate W between the carrier 1300 seated on the load port 1200 and the buffer unit 2200. The transfer frame 1400 is provided with an index rail 1420 and an index robot 1440. The index rail 1420 is provided such that its lengthwise direction is parallel to the second direction 14. The index robot 1440 is installed on the index rail 1420 and is linearly moved in the second direction 14 along the index rail 1420. The index robot 1440 has a base 1441, a body 1442, and an index arm 1443. The base 1441 is installed to be movable along the index rail 1420. The body 1442 is coupled to the base 1441. The body 1442 is provided to be movable along the third direction 16 on the base 1441. In addition, the body 1442 is provided to be rotatable on the base 1441. The index arm 1443 is coupled to the body 1442 and is provided forwardly and backwardly movable respect to the body 1442. A plurality of index arms 1443 are provided to be individually driven. The index arms 1443 are disposed to be stacked one above another while being spaced apart in the third direction 16. Some of the index arms 1443 may be used to transfer the substrate W from the process module 2000 to the carrier 1300, and the others may be used to transfer the substrate W from the carrier 1300 to the processing module 2000. This may prevent particles generated from the substrate W before a processing from being attached to the substrate W after the processing while the substrate is brought in and taken out by the index robot 1440.

The transfer chamber 2400 transfers the substrate W between the buffer unit 2200 and the process chamber 2600, and between the process chambers 2600. The transfer chamber 2400 is provided with a guide rail 2420 and a main robot 2440. The guide rail 2420 is provided such that its lengthwise direction is parallel to the first direction 12. The main robot 2440 is installed on the guide rail 2420 and is linearly moved along the first direction 12 on the guide rail 2420. The main robot 2440 has a base 2441, a body 2442, and a main arm 2443. The base 2441 is installed to be movable along the guide rail 2420. The body 2442 is coupled to the base 2441. The body 2442 is provided to be movable along the third direction 16 on the base 2441. In addition, the body 2442 is provided to be rotatable on the base 2441. The main arm 2443 is coupled to the body 2442, which is forwardly and backwardly movable respect to the body 2442. A plurality of main arms 2443 are provided to be individually driven. The main arms 2443 are stacked one above another while being spaced apart in the third direction 16. The main arm 2443 used when the substrate W is transferred from the buffer unit 2200 to the process chamber 2600 and the main arm 2443 used when the substrate W is transferred from the process chamber 2600 to the buffer unit 2200 may be different from each other.

The substrate treating apparatus 10 for performing a cleaning process on the substrate W is provided in the process chamber 2600. The substrate treating apparatus 10 provided in each process chamber 2600 may have a different structure depending on the type of cleaning process to be performed. Optionally, the substrate treating apparatus 10 in each process chamber 2600 may have the same structure. Optionally, the process chambers 2600 are divided into a plurality of groups, and substrate treating apparatuses 10 provided in the process chambers 2600 belonging to the same group may have the same structure, and substrate treating apparatuses 10 provided in the process chambers 2600 belonging to different groups may have different structures. For example, when the process chambers 2600 are divided into two groups, the process chambers 2600 of the first group may be provided at one side of the transfer chamber 2400, and process chambers 2600 of the second group may be provided at another side of the transfer chamber 2400. Optionally, at one side and another side of the transfer chamber 2400, process chambers 2600 of the first group may be provided on the lower layer, and process chambers 2600 of the second group may be provided on the upper layer, i.e., stacked on the process chambers 2600 of the first group. The process chamber 2600 of the first group and the process chamber 2600 of the second group may be classified according to the type of chemical used or the type of cleaning method, respectively.

In the following embodiment, an apparatus for cleaning the substrate W using treating fluids such as a high-temperature sulfuric acid, an alkaline chemical liquid, an acidic chemical liquid, a rinse liquid, and a dry gas will be described as an example. However, the technical idea of the inventive concept is not limited thereto, and can be applied to various types of devices that perform a process while rotating the substrate W such as an etching process, etc.

Figure 2:
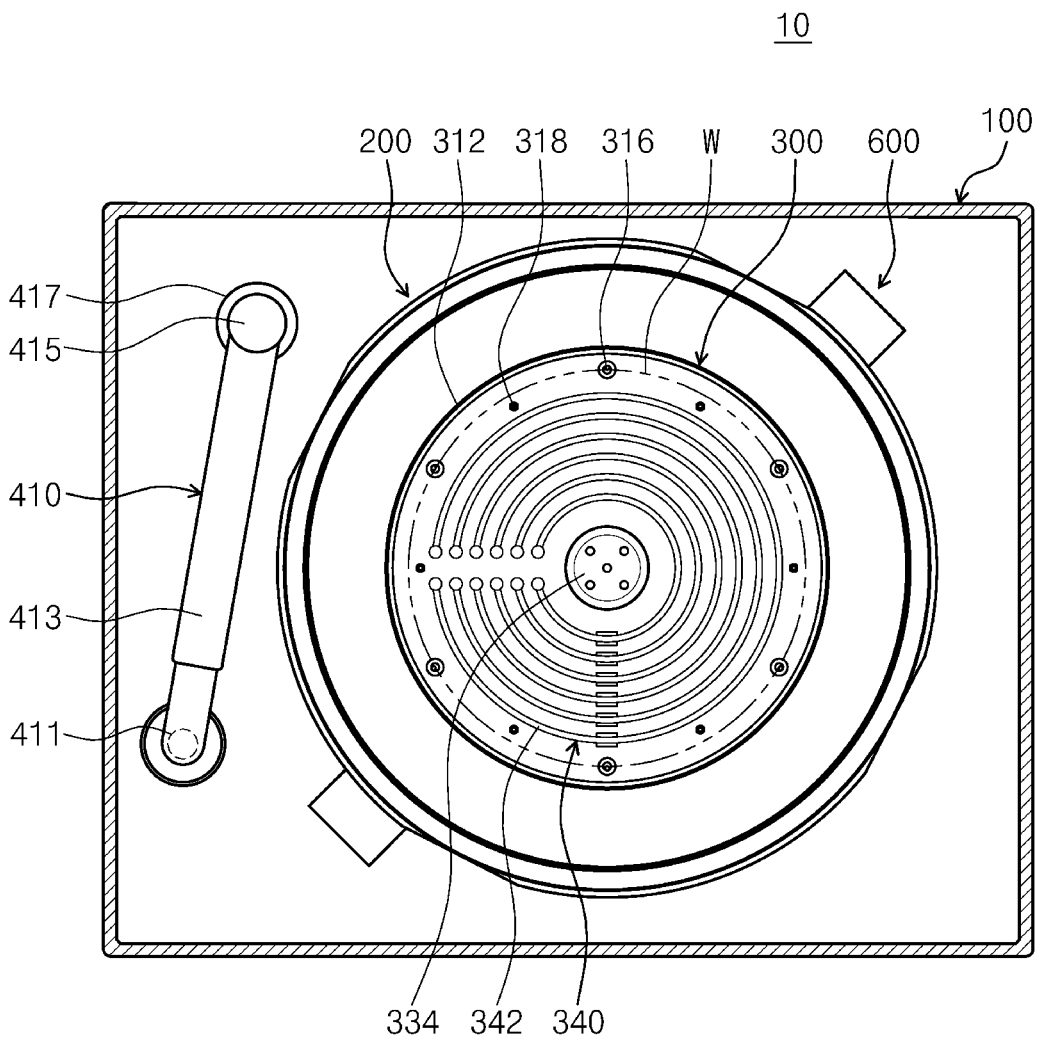
FIG. 2 is a plan view of the substrate treating apparatus of FIG. 1.
Figure 3:
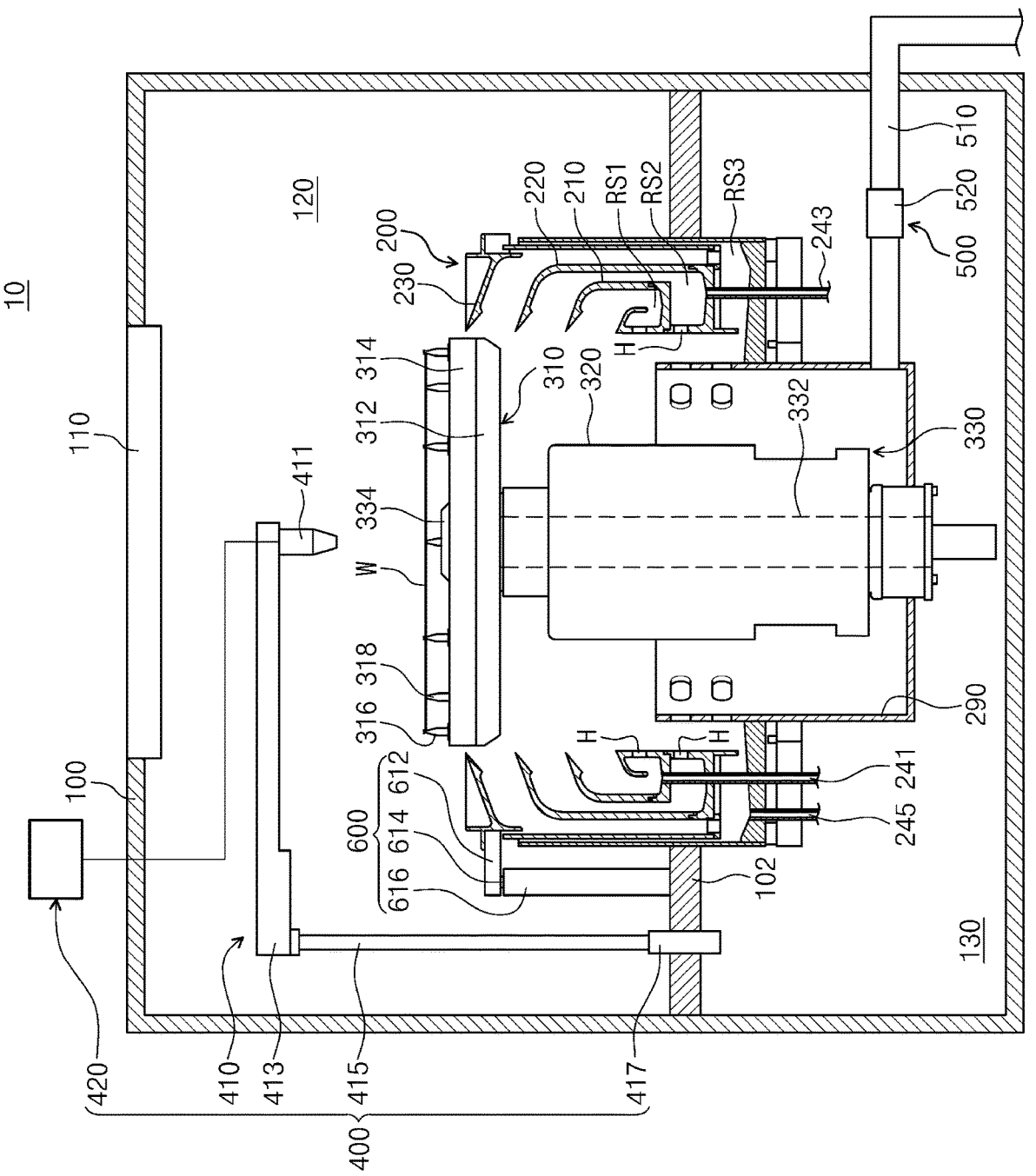
FIG. 3 is a sectional view of the substrate treating apparatus of FIG. 1.

FIG. 2 is a plan view of the substrate treating apparatus of FIG. 1, and FIG. 3 is a cross-sectional view of the substrate treating apparatus of FIG. 1.

Referring to FIG. 2 and FIG. 3, the substrate treating apparatus 10 includes a chamber 100, a bowl 200, a support unit 300, a liquid supply unit 400, an exhaust unit 500, and a lifting/lowering unit 600.

The chamber 100 provides a sealed inner space. An airflow supply member 110 is installed at the top portion. The airflow supply member 110 forms a downward airflow inside the chamber 100. The airflow supply member 110 filters high humidity outside air and supplies it into the chamber 100. The high humidity outside air passes through the airflow supply member 110 and is supplied into the chamber 100 to form a downward air flow. The downward air flow provides a uniform airflow to the top portion of the substrate W, and discharges pollutants generated during the process of treating the surface of the substrate W by the treating fluid to the exhaust unit 500 through the recollecting containers 210, 220, and 230 of the bowl 200 together with air.

The inner space of the chamber 100 is divided into a process area 120 and a maintenance area 130 by a horizontal partition wall 102. The bowl 200 and the support unit 300 are located in the process area 120. In addition to the recollecting lines 241, 243, and 245 and the exhaust line 510 connected to the bowl 200, a driving unit of the lifting/lowering unit 600, a driving unit of the treating liquid supply unit 400, and a supply line are located in the maintenance area 130. The maintenance area 130 is isolated from the process area 120.

The bowl 200 has a cylindrical shape with an open top and has a processing space for treating the substrate W. The open top side of the bowl 200 is provided as a passage through which the substrate W is taken out and brought in. The support unit 300 is located in the processing space. The support unit 300 rotates the substrate W while supporting the substrate W during the process.

The exhaust duct 290 is connected to a lower end of the bowl 200 so that forced exhaust is performed at the bowl 200. At the bowl 200, a first recollecting container 210, a second recollecting container 220, and a third recollecting container 230 for introducing and suctioning a treating liquid and a gas scattered from the rotating substrate W are disposed in multiple stages.

The annular first recollecting container 210, the second recollecting container 220, and the third recollecting container 230 have exhaust pipes H in communication with one common annular space. Specifically, each of the first to third recollecting containers 210, 220, and 230 include a bottom surface having an annular shape and sidewalls extending upward from the bottom surface thereof and having a cylindrical shape. The second recollecting container 220 surrounds the first recollecting container 210 and is spaced apart from the first recollecting container 210. The third recollecting container 230 surrounds the second recollecting container 220 and is spaced apart from the second recollecting container 220.

The first recollecting container 210, the second recollecting container 220, and the third recollecting container 230 may provide a first recollecting space RS1, a second recollecting space RS2, and a third recollecting space RS3 into which air flow including a treating liquid and a fume scattered from the substrate W is introduced. The first recollecting space RS1 is defined by the first recollecting container 210, the second recollecting space RS2 is defined by a space between the first recollecting container 210 and the second recollecting container 220, and the third recollecting space RS3 is defined by a space between the second recollecting container 220 and the third recollecting container 230.

Each top side of the first recollecting container 210, the second recollecting container 220, and the third recollecting container 230 have a central portion opened. Each edge portion of the respective top side of the first recollecting container 210, the second recollecting container 220, and the third recollecting container 230 are inclined upwardly toward the respective opened central portion. The treating liquid scattered from the substrate W is guided by the inclined edge portion and flows into the first recollecting space RS1, the second recollecting space RS2, and/or the third recollecting space RS3 of the first recollecting container 210, the second recollecting container 220 and the third recollecting container 230.

The first treating liquid introduced into the first recollecting space RS1 is discharged to the outside through the first recollecting line 241. The second treating liquid introduced into the second recollecting space RS2 is discharged to the outside through the second recollecting line 143. The third treating liquid introduced into the third recollecting space RS3 is discharged to the outside through the third recollecting line 145.

The liquid supply unit 400 may supply a treating liquid to the substrate W to process the substrate W. The liquid supply unit 400 may supply a heated treating liquid to the substrate W. The treating liquid may be a chemical for treating the surface of the substrate W. For example, it may be a high-temperature chemical for etching the surface of the substrate W. For example, the chemical may be a sulfuric acid, a phosphoric acid, or a mixture of sulfuric acid and phosphoric acid. The liquid supply unit 400 may include a liquid nozzle member 410 and a supply unit 420.

The liquid nozzle member 410 may include a nozzle 411, a nozzle arm 413, a support rod 415, and a nozzle driver 417. The nozzle 411 may receive a treating liquid from the supply unit 420. The nozzle 411 may discharge the treating liquid to the surface of the substrate W. The nozzle arm 413 is an arm that is provided to be elongated in one direction, and a nozzle 411 is mounted on a front end thereof. The nozzle arm 413 supports the nozzle 411. A support rod 415 is mounted on the rear end of the nozzle arm 413. The support rod 415 is located below the nozzle arm 413. The support rod 415 is disposed perpendicular to the nozzle arm 413. The nozzle driver 417 is provided at a lower end of the support rod 415. The nozzle driver 417 rotates the support rod 415 around an axis of a lengthwise direction of the support rod 415. The nozzle arm 413 and the nozzle 411 swing by the rotation of the support rod 416 with the support rod 416 as an axis. The nozzle 411 may swing between the outside and the inside of the bowl 200. In addition, the nozzle 411 may swing between the central region and the edge region of the substrate W and discharge the treating liquid.

The exhaust unit 500 may exhaust the inside of the bowl 200. For example, the exhaust unit 500 may provide exhaust pressure (sucking pressure) to a recollecting container for recollecting the treating liquid in the first recollecting container 210, the second recollecting container 220, and the third recollecting container 230 during the process. The exhaust unit 500 may include an exhaust line 510 and a damper 520 connected to the exhaust duct 290. The exhaust line 510 receives exhaust pressure from an exhaust pump (not shown) and is connected to a main exhaust line buried in a bottom space of the semiconductor production line.

Meanwhile, the bowl 200 is coupled to the lifting/lowering unit 600 for changing the vertical position of the bowl 200. The lifting/lowering unit 600 linearly moves the bowl 200 in an up/down direction. As the bowl 200 is moved up and down, the relative height of the bowl 200 with respect to the support unit 300 is changed.

The lifting/lowering unit 600 includes a bracket 612, a moving shaft 614, and a driver 616. The bracket 612 is fixedly installed at the outer wall of the chamber 100. The moving shaft 614 which is moved in the up/down direction by the driver 616 is fixedly coupled to the bracket 612. For loading or unloading the substrate W to or from the support unit 300, the bowl 200 is lowered by the lifting/lowering unit 600 so that the support unit 300 protrudes upward from the bowl 200. In addition, during the processing, the height of the bowl 200 is adjusted so that the treating liquid may flow into preset recollecting containers 210, 220, and 230 according to the type of treating liquid supplied to the substrate W. The bowl 200 may have different types of treating liquid and contaminated gas recollected for each of the recollecting spaces RS1, RS2, and RS3.

Figure 4:
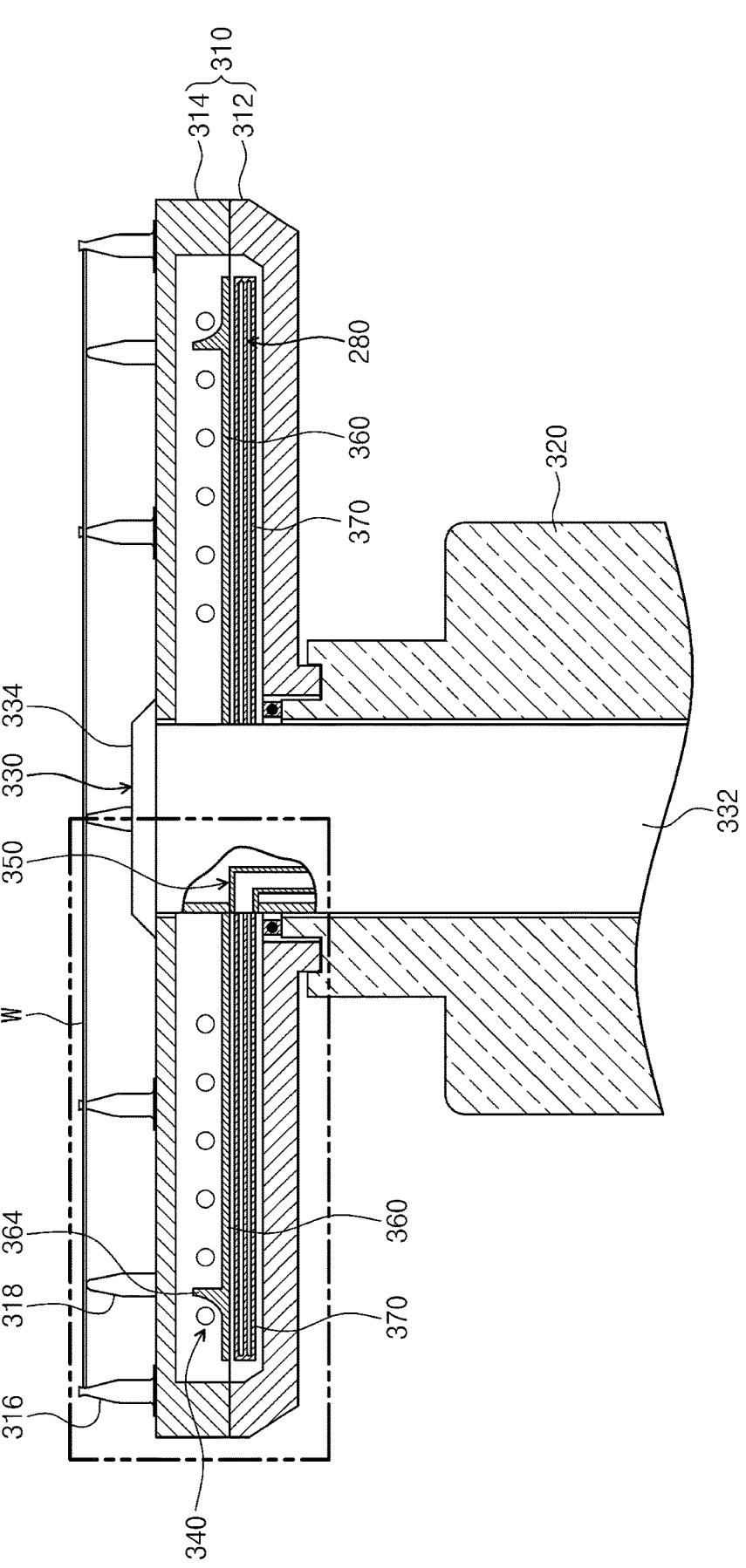
FIG. 4 is a sectional view illustrating a support unit according to an embodiment of the inventive concept.
Figure 5:
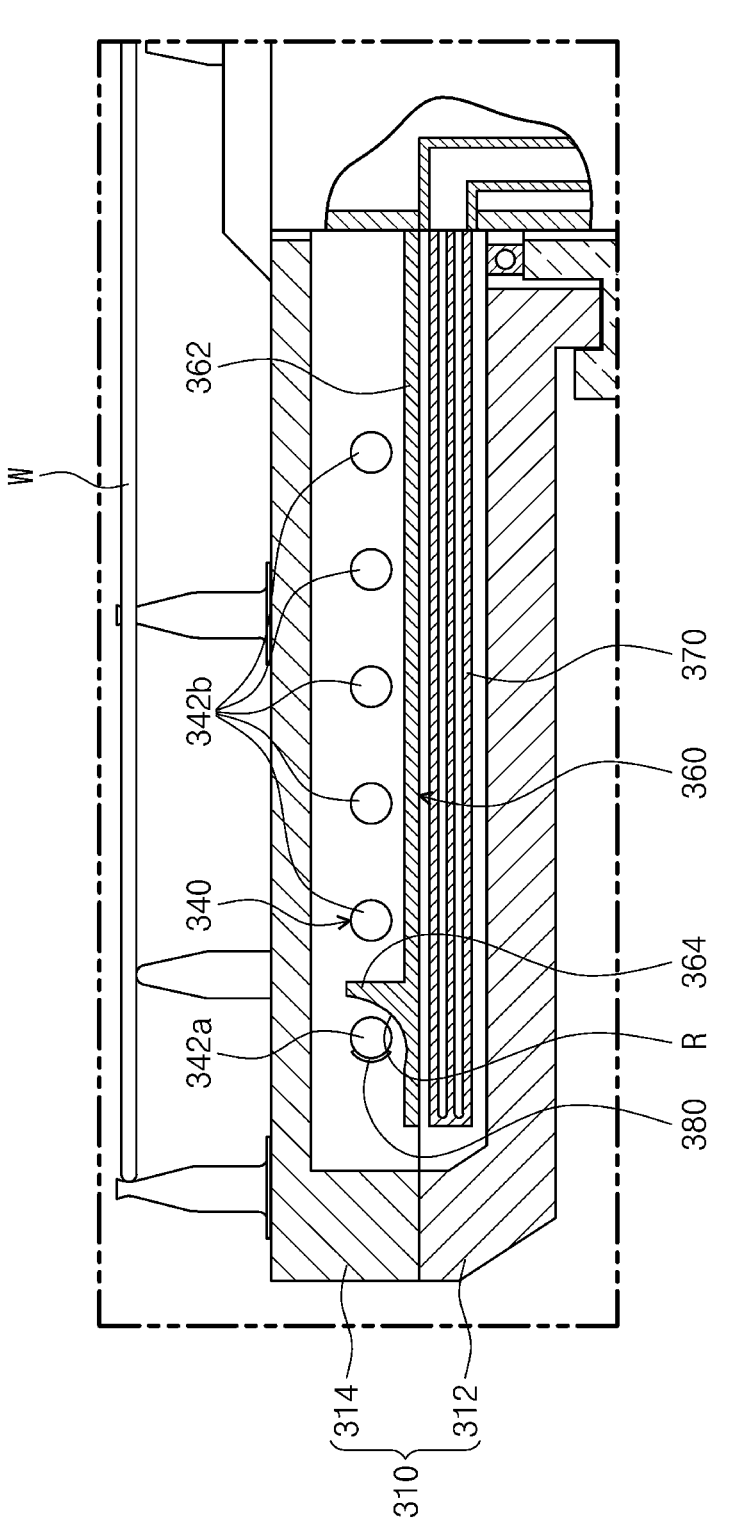
FIG. 5 is an enlarged view illustrating a part of the support unit according to an embodiment of the inventive concept.
Figure 6:
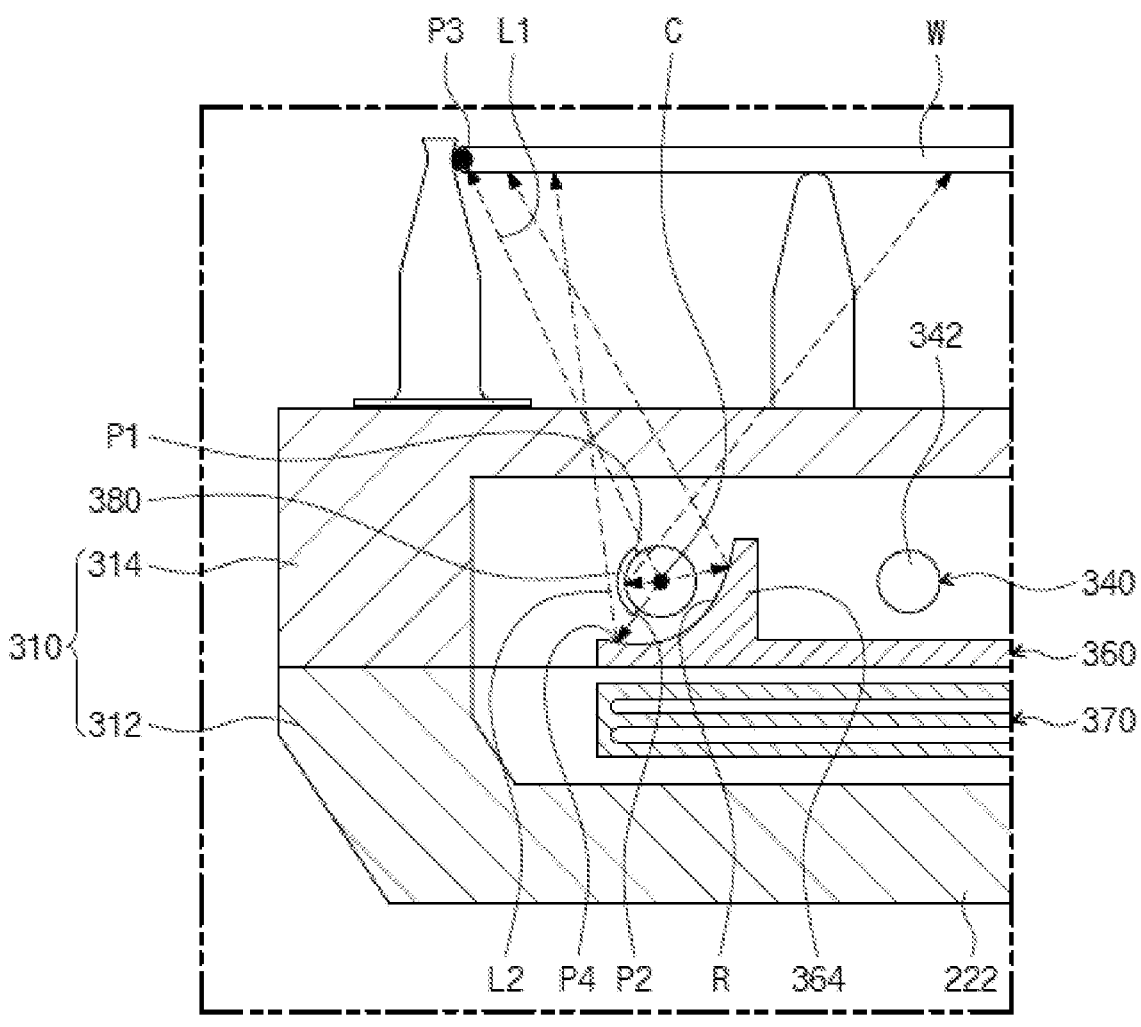
FIG. 6 is a view illustrating a state in which a heating unit according to an embodiment of the inventive concept heats a substrate.

FIG. 4 is a cross-sectional view illustrating an embodiment of the support unit according to the inventive concept, FIG. 5 is an enlarged view of a part of the support unit according to the inventive concept, and FIG. 6 is a view illustrating a heating unit heating a substrate according to the inventive concept. In particular, the cross-sectional view according to FIG. 6 is a view showing a cross-sectional view in a direction in which a coupling structure of a chuck pin 316 and a chuck 310 is visible.

Referring to FIG. 4 and FIG. 5, the support unit 300 may support the substrate W during the processing and rotate the substrate W during the processing.

The support unit 300 may include a chuck 310, a spin driving unit (i.e., a spin driver) 320, a back nozzle unit 330, a heating unit 340, a cooling member 350, a reflective plate 360, a heat sink 370, and a reflective layer 380.

The chuck 310 includes a chuck stage 312 and a transmission plate 314. The chuck stage 312 and the transmission plate 314 may be combined with each other to form an inner space. For example, the chuck stage 312 may have a "U" shape in a cross-section. In addition, the transmission plate 314 may have a cover shape covering the chuck stage 312 (e.g., reversed "U" shape in cross-section). Accordingly, the chuck stage 312 and the transmission plate 314 may be combined with each other to form an inner space. The transmission plate 314 is formed of a material capable of transmitting light emitted from the lamp 342 to be described later. For example, the transmission plate 314 may be formed of a quartz material.

The chuck stage 312 may be coupled to the spin driver 320 and rotated. A chuck pin 316 may be installed at an edge of the chuck stage 312. The chuck pin 316 upwardly protrudes from the chuck stage 312. In this case, the chuck pin 316 is provided to penetrate through the transmission plate 314 to above the transmission plate 314. In this case, a through-hole through which the chuck pin 316 passes is formed in the transmission plate 314. The diameter of the through-hole of the transmission plate 314 is formed larger than the diameter of the chuck pin 316 so that the chuck pin 316 may move up and down through the through-hole between a process position and a standby position of the substrate. A driving unit is coupled to the chuck pin 316. The driving unit provides power to the chuck pin 316 so that the chuck pin 316 may move between the process position and the standby position. The chuck pins 316 may align the substrate W so that the substrate W supported by a plurality of support pins 318 of the transmission plate 314 is placed in a precise position. During the processing, the chuck pins 316 may contact the side of the substrate W to prevent the substrate W from being separated from the precise position. The chuck pins 316 support the substrate W by contacting the side of the substrate W when the substrate W is positioned in the process position.

The transmission plate 314 is positioned between the substrate W and the chuck stage 312. The transmission plate 314 is disposed above the chuck stage 312. The transmission plate 314 is disposed between the substrate W supported by the support unit 300 and the heating unit 340. The transmission plate 314 is disposed below the substrate W supported by the support unit 300. The transmission plate 314 is disposed between the substrate W supported by the support unit 300 and the chuck stage 312. The transmission plate 314 is disposed above the chuck stage 312. The transmission plate 314 is provided to protect the heating unit 340. The transmission plate 314 may be provided transparently. The transmission plate 314 may be rotated together with the chuck stage 312. The transmission plate 314 includes the support pins 318. The support pins 318 are disposed to be spaced apart from along the edge of the upper surface of the transmission plate 314. The support pins 318 are provided to upwardly protrude from the transmission plate 314. The support pins 318 support a rear of the substrate W so that the substrate W is supported while being spaced apart from the transmission plate 314.

The spin driving unit 320 has a hollow shape and is coupled to the chuck stage 312 to rotate the chuck stage 312. When the chuck stage 312 is rotated, the transmission plate 314 may be rotated together with the chuck stage 312. In addition, components provided in the inner space of the chuck 310 may be independent of the rotation of the chuck 310. For example, the heating unit 340, the reflective plate 360, and the heat sink 370 to be described later may be independent of the rotation of the chuck 310. The heating unit 340 is provided to be non-moving when the chuck 310 rotates. The reflective plate 360 and the heat sink 370 are provided to be non-moving when the chuck 310 rotates.

The back nozzle unit 330 is provided to spray a chemical liquid onto the rear surface of the substrate W. The back nozzle unit 330 includes a nozzle body 332 and a chemical liquid spray unit 334. The chemical liquid spray unit 334 is located above the center of the chuck stage 312 and the transmission plate 314. The nozzle body 332 is built through the hollow spin driving unit 320, and a chemical liquid moving line, a gas supply line, a purge gas supply line, and the like may be provided within the nozzle body 332. The chemical liquid moving line supplies an etchant for etching the rear surface of the substrate W to the chemical liquid spray unit 334, the gas supply line supplies nitrogen gas for controlling an etching uniformity to the rear surface of the substrate W, and the purge gas supply line supplies nitrogen purge gas to prevent the etchant from penetrating between the transmission plate 314 and the nozzle body 332.

The heating unit 340 may heat the substrate W during the processing. The heating unit 340 may be disposed within the chuck 310. For example, the heating unit 340 may be disposed in the inner space of the chuck 310. The heating unit 340 includes a lamp 342 and a temperature control unit (not shown).

The lamp 342 is installed above the chuck stage 312. The lamp 342 may generate thermal energy for heating the substrate W supported by the support unit 300. The lamp 342 may heat the substrate W by irradiating light onto the substrate W supported by the support unit 300. The lamp 342 may be generally provided in a ring shape. A plurality of lamps 342 may be provided. The lamps 342 may be provided with different diameters. Each lamp 342 has a temperature control unit so that temperature control may be possible respectively. In addition, the lamp 342 may be an infrared lamp. Accordingly, the lamps 342 irradiate infrared light to heat the substrate W. A reflective layer 380 to be described later may be provided at the lamp 342.

The heating unit 340 may define a plurality of concentric heating zones. Each heating zone may be provided with lamps 342 and each heating zone can be independently heated by respective lamps. At least some of the lamps 342 may have a ring shape. In addition, the lamps 342 may have different radii with respect to the center of the chuck stage 312 but may be arranged spaced apart so that the centers coincide with each other. Although six lamps 342 are illustrated in cross-section of this embodiment, this is only an example, and the number of lamps 342 in cross-section may be increased or decreased depending on a desired temperature and a degree of control. The heating unit 340 may control independently the temperature of each individual heating zone as to continuously increase or decrease the temperature along the radial direction of the substrate W during the process.

The plurality of lamps 342 include a first lamp 342a provided at an outermost part of the plurality of lamps 342 and the remaining one or a plurality of second lamps 342b. The reflective plate 360 may have a protrusion 364 provided between the first lamp 342a and the nearest second lamp to the first lamp 342a. A reflective layer 380 is provided on the surface of the first lamp 342a.

The reflective layer 380 is provided at a position closest to the first lamp 342a of the heating unit 340. For example, the reflective layer 380 is provided at the surface of the first lamp 342a. The reflective layer 380 blocks a light emitted from the first lamp 342a so as not to directed to neighboring components. In more detail, the reflective layer 380 may reflect light emitted from the first lamp 342a to change the optical path toward the substrate W.

The reflective layer 380 is provided on at least a portion of the surface of the lamp 342. The reflective layer 380 may be provided on a surface of the first lamp 342a that does not face the protrusion 346. In this case, the first lamp 342a may be disposed between the reflective layer 380 the protrusion 346. The reflective layer 380 is not provided in a region of the surface of the first lamp 342a where light emitted from the first lamp 342a directly travels to the substrate W. In other words, the reflective layer 380 may be provided on a portion of the surface of the first lamp 342a where light emitted from the first lamp 342a is not directed to the substrate W.

The reflective layer 380 may be provided on the surface of the lamp 342 which is opposite to a surface facing the protrusion 364, e.g., on the surface of the first lamp 342a facing the chuck pin 316. The reflective layer 380 may be provided on the surface of the lamp 342 which is opposite to a surface facing a curved surface R of the protrusion 364. The reflective layer 380 includes a round shape. In this case, the curvature of the inner surface of the reflective layer 380 may correspond to the curvature of the first lamp 342a.

The reflective layer 380 is made of a material having a strong heat resistance to a thermal energy emitted from the lamp 342. The reflective layer 380 is formed of a material having a high cutoff rate or a high reflexibility with respect to the thermal energy emitted from the lamp 342. For example, the reflective layer 380 may be formed of a metal material. For example, the reflective layer 380 may be formed of any one of gold, silver, copper, aluminum, or ceramic. For example, the reflective layer 380 may be formed of the same material as the reflective plate 360. Alternatively, the reflective layer 380 may be formed of a material different from that of the reflective plate 360.

The reflective layer 380 is provided at a position that blocks a light in a direction not toward the substrate W among a light emitted from the first lamp 342. The reflective layer 380 blocks the light directly emitted from the first lamp 342 in a direction not toward the substrate W. The reflective layer 380 is provided at a position capable of reflecting the light directly emitted from the lamp 342 in a direction not toward the substrate W, and the light reflected by the reflective layer 380 is irradiated to the substrate W. The reflective layer 380 blocks light emitted from the lamp 342 and reflected by the reflective plate 360 in a direction not directed toward the substrate W. In this case, the reflective layer 380 is provided at a position capable of reflecting the light emitted from the lamp 342 and reflected by the reflective plate 360 in a direction not directed toward the substrate W, and the light reflected by the reflective layer 380 is irradiated to the substrate W. As described above, according to the inventive concept, by applying the reflective layer 380 to the surface of the lamp 342, an optical path of light emitted in a direction not directed toward the substrate W may be changed, thereby increasing the efficiency of the lamp 342. Furthermore, the light emitted in a direction not facing (not traveling to) the substrate W may be blocked, thereby preventing thermal deformation and thermal damage of peripheral components of the substrate W.

Referring to FIG. 6, the reflective layer 380 is provided between the first end P1 and the second end P2 of the surface of the lamp 342. When viewed in a vertical cross-section, the first end P1 of the reflective layer 380 is positioned on the first path L1 of light emitted from the first lamp 342a and irradiated to a third point P3 of the substrate W to be described later. In addition, referring to FIG. 6, when the reflective layer 380 is viewed from a vertical cross-section cut, the first end P1 of the reflective layer 380 is positioned on a line passing through the center C of the first lamp 342a and the third point P3 of the substrate W when the substrate is supported by the chuck pin 316. The second end P2 of the reflective layer 380 is positioned on the second path L2 of light emitted from the first lamp 342a and irradiated to the edge region P4 of the reflective plate 360.

Among the light emitted from the first lamp 342a, light passing through the first end P1 of the first lamp 342a is irradiated to the third point P3 in FIG. 6. The third point P3 may refer to an end portion of the substrate W supported by the support unit 300. In addition, the third point P3 may mean a point at which the substrate W supported by the support unit 300 contacts the chuck pin 316. The second end P2 of the reflective layer 380 is positioned on the second path L2 of light emitted from the lamp 342 and irradiated to the edge region P4 of the reflective plate 360. The second path L2 may be a path connecting the center C of the lamp 342 to the outer edge region P4 of the reflective plate 360. That is, among the light emitted from the first lamp 342a, light passing through the second end P2 of the first lamp 342a is irradiated to the outer edge region P4 of the reflective plate 360 and is reflected by the reflective plate 360 to be irradiated to the substrate W.

Unlike this invention, when the reflective layer 380 is not applied, light emitted between the first end P1 and the second end P2 is irradiated to neighboring components to cause thermal damage and/or thermal deformation. However, in the inventive concept, light emitted between the first end P1 and the second end P2 among the light emitted from the first lamp 342a is reflected and directed toward the substrate W by the reflective layer 380. Accordingly, the efficiency of the lamp 342 can be increased by concentrating the heat energy radially and uniformly emitted from the first lamp 342a onto the substrate W, and thermal deformation and/or thermal damage of neighboring peripheral components can be prevented by suppressing an increase in temperature of neighboring components due to thermal energy.

The cooling member 350 may supply a cooling fluid into the chuck 310. For example, the cooling member 350 may supply a cooling fluid to a flow path 372 formed in the heat sink 370 to be described later. The cooling fluid may be a gas. The cooling fluid may be an inert gas. For example, the cooling fluid may be an inert gas containing nitrogen.

The reflective plate 360 may reflect the thermal energy generated by the heating unit 340 to the substrate W. The reflective plate 360 may reflect the thermal energy generated by the heating unit 340 to the edge region of the substrate W and/or the central region of the substrate W. The reflective plate 360 may be made of a material having a high reflective efficiency with respect to the thermal energy generated by the heating unit 340. The reflective plate 360 may be made of a material having a high reflection efficiency with respect to the light irradiated by the lamp 342. For example, the reflective plate 360 may be made of a material including gold, silver, copper, and/or aluminum. The reflective plate 360 may be made of a material coated with gold, silver, copper, and/or aluminum on quartz. The reflective plate 360 may be made of a material in which gold, silver, copper, and/or aluminum are coated on quartz by a physical vapor deposition (PVD) method.

The reflective plate 360 may be disposed within the chuck 310. The reflective plate 360 may be disposed in the inner space formed by combining the chuck stage 312 and the transmission plate 314. The reflective plate 360 may have a substantially disk shape when viewed from above. For example, the reflective plate 360 may have a disk shape in which an opening is formed in the central region thereof when viewed from above. The reflective plate 360 may be formed of a reflective material, or the reflective material may be coated on the surface of the reflective plate 360.

The reflective plate 360 may include a base 362 and the protrusion 364. The base 362 may be disposed under the heating unit 340. The base 362 may be disposed under the lamp 342. The protrusion 364 may protrude upward from the base 362. The protrusion 364 may be disposed between adjacent lamps 342. For example, the protrusion 364 may be disposed between a lamp 342 disposed at the outermost portion among the lamps 342 when viewed from above, and the lamp 342 closest to the lamp 342 disposed at the outermost portion among the lamps 342. In addition, the protrusion 364 may have an arc shape. In addition, a plurality of protrusion 364 may be provided. The protrusions 364 viewed from the top may be combined with each other to form a substantially ring shape.

In addition, at least some of a surface of the base 362 and/or the protrusion 364 may be curved. For example, surfaces of the base 362 and/or the protrusion 364 facing the heating unit 340 may be curved. For example, the surfaces of the base 362 and/or the protrusion 364 may include a curved surface R that reflects light irradiated by the lamp 342 to the substrate W, e.g., the edge region of the substrate W. For example, surfaces of the base 362 and the protrusion 364 may be combined with each other to form a curved surface R. When a light for heating the substrate W is irradiated from the lamp 342, a portion of the light irradiated by the lamp 342 may be directly irradiated to the substrate W, and a portion of light irradicated by the lamp 342 may be reflected by the reflective surface of the reflective plate 360 to be indirectly irradiated to the substrate W.

The heat sink 370 may be disposed within the chuck 310. The heat sink 370 may be disposed in the inner space formed by the combination of chuck stage 312 and the transmission plate 314. The heat sink 370 may have a generally disk shape when viewed from above. A cooling flow path through which the cooling fluid supplied by the cooling member 350 may flow may be formed within the heat sink 370. In addition, the heat sink 370 may be made of a material having a high thermal conductivity so as to minimize the heat generated by the heating unit 340 from increasing the temperature of the spin driving unit 320. When the heat sink 370 is made of a material having a high thermal conductivity, the heat sink 370 may quickly dissipate heat to the outside of the support unit 300. This is to prevent the spin driver 320 from being improperly driven when the temperature of the spin driver 320 becomes excessively high. The heat sink 370 may be made of a material containing aluminum. In addition, the heat sink 370 may be made of a material having a higher thermal conductivity than the reflective plate 360.

The effects of the inventive concept are not limited to the above-mentioned effects, and the unmentioned effects can be clearly understood by those skilled in the art to which the inventive concept pertains from the specification and the accompanying drawings.

Although the embodiments of the inventive concept have been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:
1. A substrate support unit supporting a substrate, the substrate support unit comprising:

a chuck supporting and rotating the substrate, wherein the chuck defines an inner space having an upper inner surface and a side inner surface connected to the upper inner surface;

a heating unit disposed within the inner space and provided below the upper inner surface of the inner space to heat the substrate, wherein the heating unit comprises a plurality of lamps along a plane parallel to the upper inner surface of the inner space, and wherein the plurality of lamps include a first lamp which is an outermost lamp among the plurality of lamps; and a reflective layer provided on a first surface of the first lamp, wherein the reflective layer is provided only at the first lamp among the plurality of lamps and is disposed between the first surface of the first lamp and the side inner surface of the inner space, wherein the reflective layer is disposed between the first surface of the first lamp and the side inner surface of the inner space, wherein the heating unit further comprises:

a reflective plate disposed in the inner space of the chuck, and wherein the reflective plate includes:

a body plate disposed under the plurality of lamps; and a protrusion extending from an upper surface of the body plate toward the upper inner surface of the inner space, wherein the protrusion is disposed between a second surface, opposite to the first surface, of the first lamp and a second lamp adjacent to the first lamp.

2. The substrate support unit of claim 1, wherein the first surface of the first lamp has a first portion facing the side inner surface of the inner space and a second portion opposite to the first portion, wherein the reflective layer is provided only in the first portion of the first portion and the second portion.

3. The substrate support unit of claim 1, wherein the protrusion further includes a curved side surface facing the first lamp and a side surface opposite to the curved side surface and facing the second lamp, wherein the side surface of the protrusion extends vertically from the upper surface of the body plate toward the upper inner surface of the inner space, and wherein the protrusion has a decreasing width between the curved side surface and the side surface thereof from the upper surface of the body plate toward the upper inner surface of the inner space.

4. The substrate support unit of claim 3, wherein the reflective layer is adjacent to the first lamp and reflects lights that are emitted from the first lamp toward the side inner surface of the inner space so that the reflected lights are directed toward the upper inner surface of the inner space.

5. The substrate support unit of claim 1, wherein the first lamp is provided as a ring shape and emits lights radially, wherein the reflective layer reflects part of lights directed toward the side inner surface of the inner space so that the reflected lights are directed toward the upper inner surface of the inner space.

6. A substrate treating apparatus comprising:

a bowl having an inner processing space;

a support unit supporting a substrate within the inner processing space of the bowl; and a liquid supply unit supplying a treating liquid to the substrate supported by the support unit, wherein the support unit comprises:

a chuck supporting and rotating a substrate, wherein the chuck defines an inner space having an upper inner surface and a side inner surface connected to the upper inner surface;

a heating unit disposed within the inner space and provided below the upper inner surface of the inner space to heat the substrate, wherein the heating unit comprises a plurality of lamps along a plane parallel to the upper inner surface of the inner space, wherein the plurality of lamps includes a first lamp which is an outermost lamp among the plurality of lamps; and a reflective layer provided on a first surface of the first lamp, and wherein the reflective layer is provided only at the first lamp among the plurality of lamps and is disposed between the first surface of the first lamp and the side inner surface of the inner space, wherein the heating unit further comprises:

a reflective plate disposed in the inner space of the chuck, and wherein the reflective plate includes:

a body plate disposed under the plurality of lamps; and a protrusion extending from an upper surface of the body plate toward the upper inner surface of the inner space, wherein the protrusion is disposed between a second surface, opposite to the first surface, of the first lamp and a second lamp adjacent to the first lamp.

7. The substrate treating apparatus of claim 6, wherein the first lamp is provided as a ring shape, wherein a surface of the first lamp has a first portion facing the side inner surface of the inner space and a second portion opposite to the first portion, wherein the reflective layer is provided with the first portion only, and wherein the first portion corresponds to the first surface.

8. The substrate treating apparatus of claim 6, wherein the chuck comprises a chuck stage and a transmission plate in combination defining the inner space, and wherein the transmission plate is adjacent to the substrate and is transparent.

9. The substrate treating apparatus of claim 8, further comprising:

a chuck pin upwardly protruding from the chuck stage during processing and supporting an edge of the substrate.

10. The substrate treating apparatus of claim 8, wherein the heating unit is provided to be non-rotatory while the chuck is rotating.

11. The substrate treating apparatus of claim 9, wherein the reflective layer is adjacent to the first lamp and a first end portion of the reflective layer is located on a line passing a center of the first lamp and a contact point of the chuck pin at which the substrate supported by the chuck pin is to be placed.

12. The substrate treating apparatus of claim 6, wherein when viewed in a cross-sectional view, the protrusion includes a curved side surface facing the first lamp and a side surface opposite to the curved side surface.

13. A substrate treating apparatus comprising:

a bowl with an inner processing space;

a support unit supporting a substrate inside the inner processing space of the bowl;

a liquid supply unit supplying a treating liquid to the substrate supported by the support unit, wherein the support unit comprises:

a chuck stage supporting and rotating the substrate;

a heating unit heating the substrate supported by the chuck stage;

a transmission plate placed between the substrate supported by the support unit and the heating unit, transmitting a light emitted from the heating unit, wherein the chuck stage and the transmission plate define an inner space having an upper inner surface and a side inner surface connected to the upper inner surface, wherein the heating unit is disposed within the inner space and provided below the upper inner surface of the inner space to heat the substrate, wherein the heating unit comprises a plurality of lamps along a plane parallel to the upper inner surface of the inner space, and wherein the plurality of lamps include a first lamp which is an outermost lamp among the plurality of lamps and is provided as a ring shape;

a reflective layer provided on a first surface of the first lamp; and a reflective plate disposed in the inner space, wherein the reflective layer is provided only at the first lamp among the plurality of lamps and is disposed between the first surface of the first lamp and the side inner surface of the inner space, wherein a surface of the first lamp has a first portion facing the side inner surface of the inner space and a second portion opposite to the first portion, wherein the reflective layer is provided only in the first portion of the first portion and the second portion, wherein the reflective layer partially covers an outer surface of the ring shape to direct lights emitted from the first lamp toward the upper inner surface of the inner space, wherein the partially covered outer surface of the ring shape corresponds to the first surface of the first lamp, and wherein the reflective plate includes:

a body plate disposed under the plurality of lamps; and a protrusion extending from an upper surface of the body plate toward the upper inner surface of the inner space, wherein the protrusion is disposed between a second surface, opposite to the first surface, of the first lamp and a second lamp adjacent to the first lamp.

* * * * *